United States Patent
Arita et al.

(10) Patent No.: US 9,963,544 B2
(45) Date of Patent: May 8, 2018

(54) ACTIVE ESTER RESIN CONTAINING PHOSPHORUS ATOM, EPOXY RESIN COMPOSITION AND CURED PRODUCT THEREOF, PREPREG, CIRCUIT BOARD, AND BUILD-UP FILM

(71) Applicant: DIC Corporation, Tokyo (JP)

(72) Inventors: Kazuo Arita, Ichihara (JP); Etsuko Suzuki, Ichihara (JP)

(73) Assignee: DIC Corporation, Tokyo (JP)

( * ) Notice: Subject to any disclaimer, the term of this patent is extended or adjusted under 35 U.S.C. 154(b) by 335 days.

(21) Appl. No.: 14/897,100

(22) PCT Filed: Feb. 6, 2014

(86) PCT No.: PCT/JP2014/052743
§ 371 (c)(1),
(2) Date: Dec. 9, 2015

(87) PCT Pub. No.: WO2014/199655
PCT Pub. Date: Dec. 18, 2014

(65) Prior Publication Data
US 2016/0130391 A1    May 12, 2016

(30) Foreign Application Priority Data

Jun. 10, 2013    (JP) .................................. 2013-121752

(51) Int. Cl.
*C08G 63/692*    (2006.01)
*C08G 59/42*    (2006.01)
(Continued)

(52) U.S. Cl.
CPC ........... *C08G 63/692* (2013.01); *C08G 59/40* (2013.01); *C08G 59/423* (2013.01); *C08J 5/24* (2013.01);
(Continued)

(58) Field of Classification Search
CPC .. C08G 59/42; C08G 63/692; C08G 63/6922; C08G 63/6924; C08G 63/6926; C08G 63/6928; C08G 63/00
See application file for complete search history.

(56) References Cited

U.S. PATENT DOCUMENTS

2012/0095156 A1*   4/2012   Hayashi ............ C07F 9/657172
                                                                524/541

FOREIGN PATENT DOCUMENTS

JP    2009-235165 A    10/2009
JP    2012-246367 A    12/2012
(Continued)

OTHER PUBLICATIONS

JP2012246367 English Machine Translation prepared on Dec. 6, 2017. (Year: 2017).*

(Continued)

*Primary Examiner* — Christopher M Rodd
(74) *Attorney, Agent, or Firm* — Locke Lord LLP

(57) ABSTRACT

The present invention provides an active ester resin containing a phosphorus atom capable of providing a cured product having all of flame retardancy, heat resistance, and dielectric characteristics, an epoxy resin composition containing the same as a curing agent, a cured product thereof, a prepreg, a circuit board, and a build-up film. The active ester resin containing a phosphorus atom has Structure (I) in which a structural unit (α) in which a plurality of aromatic nuclei (X) are connected through an alicyclic hydrocarbon group is connected with another structural unit (α) through an arylene dicarbonyloxy group, and, at least one of the aromatic nuclei (X) present in the resin has a structural site (Y) represented by any one of the following Structural Formulas (y1) to (y4) as a substituent on the aromatic nucleus.

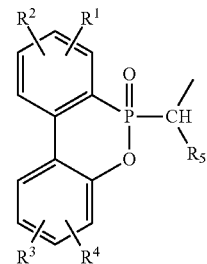

(y1)

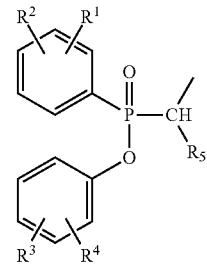

(y2)

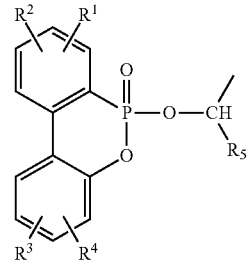

(y3)

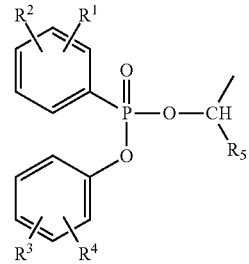

(y4)

6 Claims, 2 Drawing Sheets

(51) Int. Cl.
 *C08J 5/24* (2006.01)
 *C08G 59/40* (2006.01)
 *H05K 1/03* (2006.01)

(52) U.S. Cl.
 CPC ........ *H05K 1/0326* (2013.01); *C08J 2363/00* (2013.01)

(56) References Cited

FOREIGN PATENT DOCUMENTS

| | | | |
|---|---|---|---|
| JP | 2012246367 A | * | 12/2012 |
| WO | WO-2010/106698 A1 | | 9/2010 |
| WO | WO-2010106698 A1 | * | 9/2010 ........ C07F 9/657172 |

OTHER PUBLICATIONS

International Search Report dated May 13, 2014, issued for PCT/JP2014/052743.

* cited by examiner

[Fig. 1]
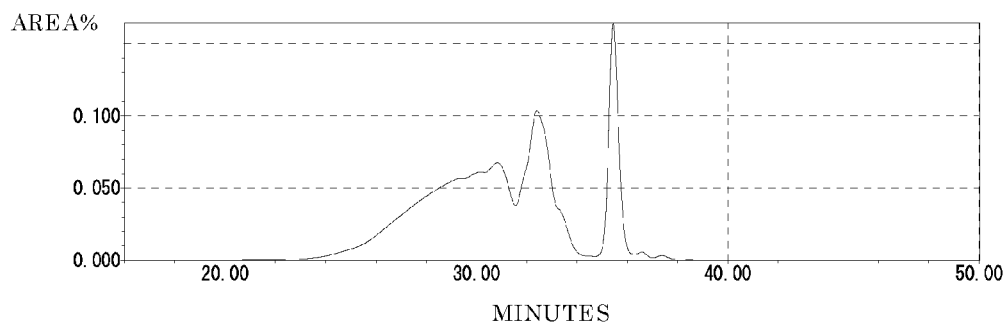
[Fig. 2]
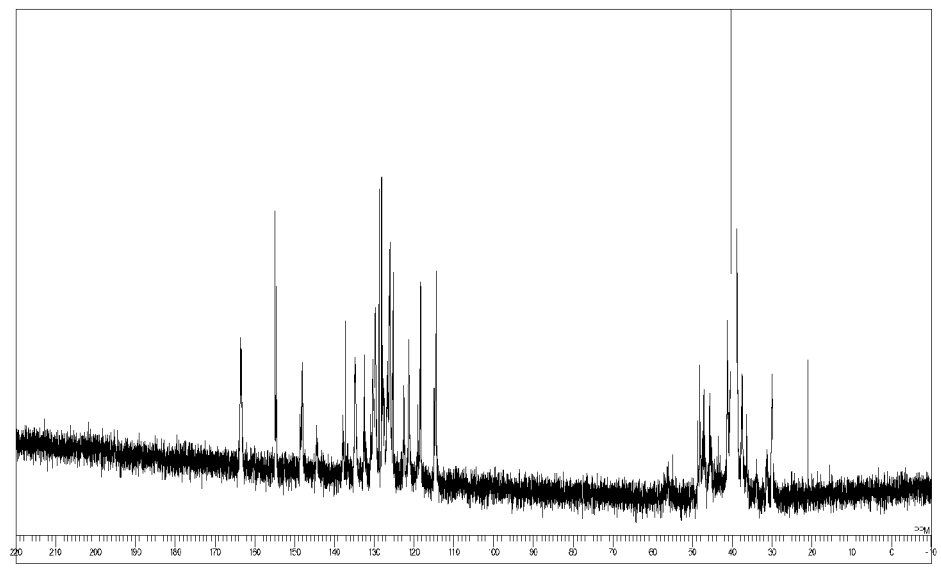
[Fig. 3]
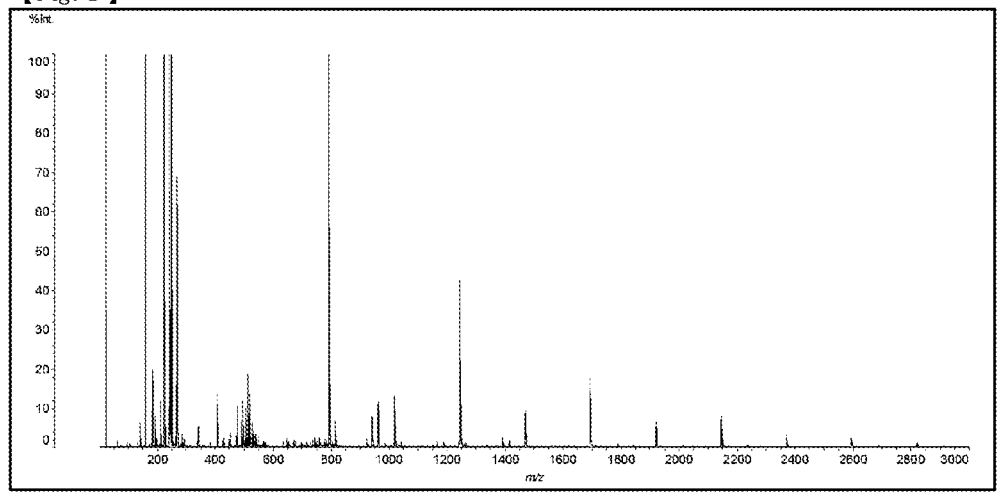

【Fig. 4】
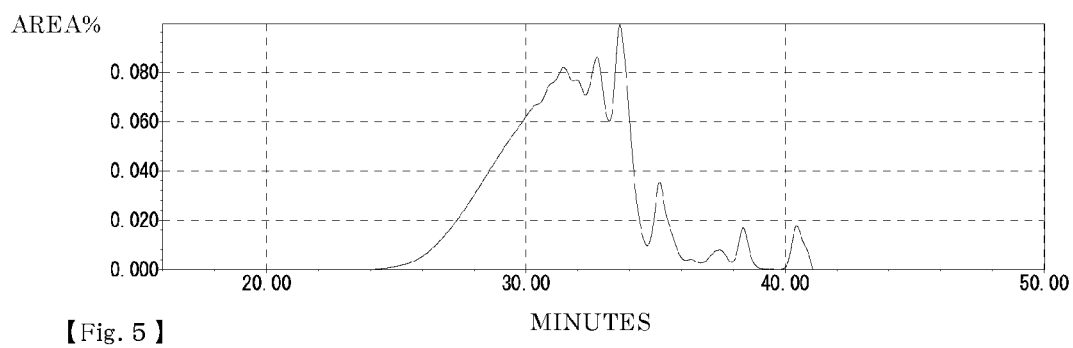
【Fig. 5】
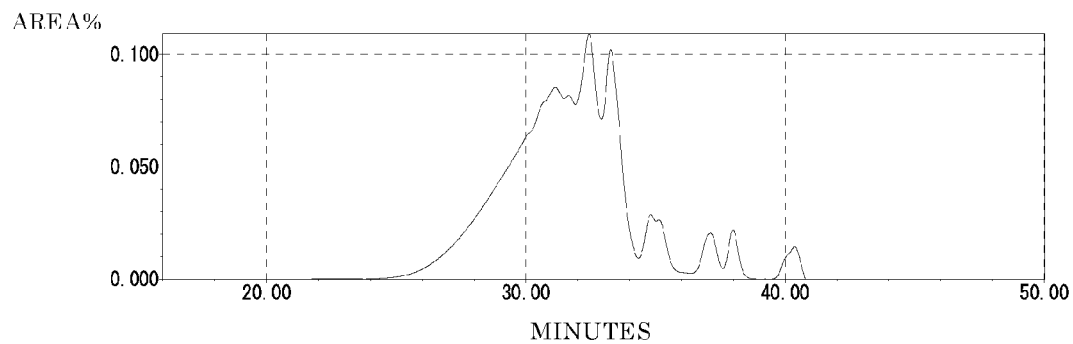

ACTIVE ESTER RESIN CONTAINING PHOSPHORUS ATOM, EPOXY RESIN COMPOSITION AND CURED PRODUCT THEREOF, PREPREG, CIRCUIT BOARD, AND BUILD-UP FILM

TECHNICAL FIELD

The present invention relates to an active ester resin containing a phosphorus atom capable of providing a cured product having all of flame retardancy, heat resistance, and dielectric characteristics, an epoxy resin composition containing the same as a curing agent, a cured product thereof, a prepreg, a circuit board, and a build-up film.

BACKGROUND ART

Since the cured product of a curable resin composition formed of an epoxy resin and a curing agent thereof has excellent heat resistance, moisture resistance, and insulating properties, the curable resin composition is widely used as a sealant for a semiconductor or an insulating material for a printed wiring board.

Among these, in printed wiring board applications, with a trend of miniaturization or performance enhancement of electronic devices, realization of a high density wiring by narrowing a wiring pitch has been demanded, and as a semiconductor mounting method corresponding thereto, instead of the wire bonding method in the related art, a flip chip connection method of bonding a semiconductor device and a wiring board by solder balls has become a mainstream. In the flip chip connection method, solder balls are placed between a wiring board and a semiconductor, a wiring board and a semiconductor are bonded by heating the whole to reflow the solder, and thus, a wiring board insulating material having higher heat resistance has been demanded. At the same time as this, with technological innovations such as increase in speed and frequency of signals in electronic device, and exclusion of a halogen-based flame retardant, a resin material capable of realizing further reduction in a dielectric constant and dielectric tangent and high flame retardancy even in a halogen-free state has been demanded.

A technology for using an active ester compound obtained by esterifying a dicyclopentadiene phenolic resin and α-naphthol with isophthalic acid chloride as a material capable of realizing a low dielectric constant and a low dielectric tangent, as a curing agent for an epoxy resin, is known (refer to PTL 1). An epoxy resin composition using the active ester compound described in PTL 1 is a composition successful in reducing both the dielectric constant and the dielectric tangent compared to the case of using a phenol novolak-type active ester resin known in the related art. However, such an active ester compound has a dicyclopentadiene skeleton in the molecular structure, and thus, the cured product is likely to burn, and does not have sufficient heat resistance.

CITATION LIST

Patent Literature

[PTL 1] JP-A-2009-235165

SUMMARY OF INVENTION

Technical Problem

Therefore, an object of the present invention is to provide an active ester resin containing a phosphorus atom capable of providing a cured product having all of flame retardancy, heat resistance, and dielectric characteristics, an epoxy resin composition containing the same as a curing agent, a cured product thereof, a prepreg, a circuit board, and a build-up film.

Solution to Problem

As a result of intensive studies to achieve the object, the present inventors found that an active ester resin which has Structure (I) in which a structural unit (α) in which a plurality of aromatic nuclei (X) are connected through an alicyclic hydrocarbon group is connected with another structural unit (α) through an arylene dicarbonyloxy group, and in which some or all of the aromatic nuclei (X) present in the resin have structural sites (Y) represented by any one of the following Structural Formulas (y1) to (y4) as a substituent on the aromatic nucleus does not impair the features of an active ester having excellent dielectric characteristics and has excellent heat resistance and flame retardancy, and completed the present invention.

[Chem. 1]

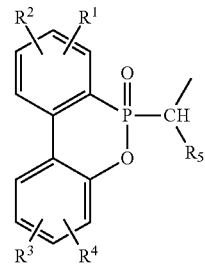

(y1)

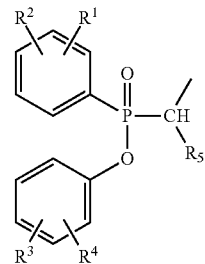

(y2)

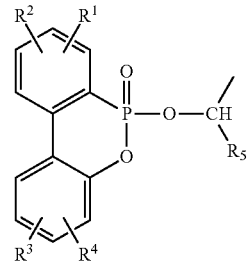

(y3)

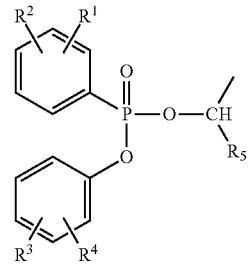

(y4)

[In Structural Formulas (y1) to (y4), each of $R^1$, $R^2$, $R^3$, and $R^4$ independently represents any one of a hydrogen atom, an alkyl group having 1 to 4 carbon atoms, an alkoxy group having 1 to 4 carbon atoms, a halogen atom, a phenyl group, and an aralkyl group, and $R^5$ represents any one of a hydrogen atom, an alkyl group having 1 to 6 carbon atoms, a phenyl group, a naphthyl group, an anthryl group, a phenyl group having one or more alkyl groups or alkoxy groups having 1 to 4 carbon atoms on an aromatic nucleus thereof, a naphthyl group having one or more alkyl groups or alkoxy groups having 1 to 4 carbon atoms on an aromatic nucleus thereof, an anthryl group having one or more alkyl groups or alkoxy groups having 1 to 4 carbon atoms on an aromatic nucleus thereof, and an aralkyl group.]

That is, the present invention relates to an active ester resin containing a phosphorus atom which has Structure (I) in which the structural unit (α) in which a plurality of aromatic nuclei (X) are connected through an alicyclic hydrocarbon group is connected with another structural unit (α) through an arylene dicarbonyloxy group, in which at least one of the aromatic nuclei (X) present in the resin has the structural site (Y) represented by any one of the following Structural Formulas (y1) to (y4) as a substituent on the aromatic nucleus.

[Chem. 2]

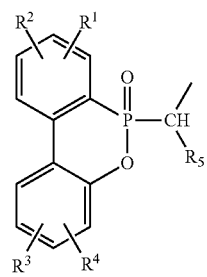

(y1)

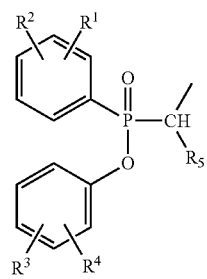

(y2)

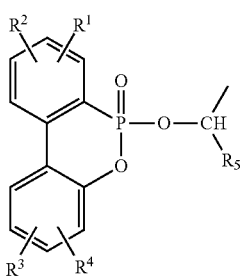

(y3)

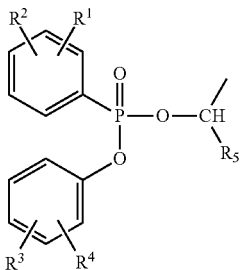

(y4)

[In Structural Formulas (y1) to (y4), each of $R^1$, $R^2$, $R^3$, and $R^4$ independently represents any one of a hydrogen atom, an alkyl group having 1 to 4 carbon atoms, an alkoxy group having 1 to 4 carbon atoms, a halogen atom, a phenyl group, and an aralkyl group, and $R^5$ represents any one of a hydrogen atom, an alkyl group having 1 to 6 carbon atoms, a phenyl group, a naphthyl group, an anthryl group, a phenyl group having one or more alkyl groups or alkoxy groups having 1 to 4 carbon atoms on an aromatic nucleus thereof, a naphthyl group having one or more alkyl groups or alkoxy groups having 1 to 4 carbon atoms on an aromatic nucleus thereof, an anthryl group having one or more alkyl groups or alkoxy groups having 1 to 4 carbon atoms on an aromatic nucleus thereof, and an aralkyl group.]

The present invention further relates to a production method of an active ester resin containing a phosphorus atom, the method including: reacting a phenolic compound (A) having a structure in which a plurality of aromatic nuclei (X) are connected through an alicyclic hydrocarbon group with an aromatic dicarboxylic acid or dihalide thereof (B) in a proportion in which the total of the carboxyl group or the acid halide group contained in the aromatic dicarboxylic acid or the dihalide thereof (B) is within a range of 0.25 moles to 0.75 moles with respect to the total 1 mole of the hydroxyl groups contained in the phenolic compound (A), to obtain a phenolic resin intermediate (C); and reacting the phenolic resin intermediate (C), an aldehyde compound (D), and the compound (E) containing a phosphorus atom represented by any one of the following Structural Formula (e1) or (e2).

[Chem. 3]

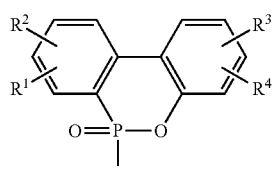

(e1)

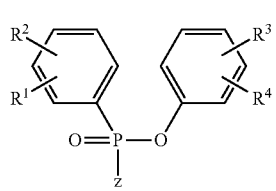

(e2)

[In Structural Formula (e1) or (e2), each of $R^1$, $R^2$, $R^3$, and $R^4$ independently represents anyone of a hydrogen atom, an alkyl group having 1 to 4 carbon atoms, an alkoxy group having 1 to 4 carbon atoms, a halogen atom, a phenyl group, and an aralkyl group, and z represents a hydrogen atom or a hydroxyl group.]

The present invention still further relates to an active ester resin containing a phosphorus atom obtained by the production method.

The present invention still further relates to an epoxy resin composition containing the novel active ester resin and an epoxy resin.

The present invention still further relates to a cured product obtained by curing the epoxy resin composition.

The present invention still further relates to a prepreg obtained by impregnating a reinforcement basic material with one prepared by diluting the epoxy resin composition with an organic solvent, and semi-curing the obtained impregnated basic material.

The present invention still further relates to a circuit board produced by diluting the epoxy resin composition with an organic solvent to obtain a varnish, forming the varnish into a plate shape, and heat and pressure-molding the vanish and a copper foil.

The present invention still further relates to a build-up film obtained by applying the epoxy resin composition diluted with an organic solvent onto a basic material film and drying the resultant product.

Advantageous Effects of Invention

According to the present invention, it is possible to provide an active ester resin containing a phosphorus atom capable of providing a cured product having all of flame retardancy, heat resistance, and dielectric characteristics, an epoxy resin composition containing the same as a curing agent, a cured product thereof, a prepreg, a circuit board, and a build-up film.

BRIEF DESCRIPTION OF DRAWINGS

FIG. 1 is a GPC chart of an active ester resin (1) obtained in Synthesis Example 1.
FIG. 2 is a $^{13}$C-NMR chart of the active ester resin (1) obtained in Synthesis Example 1.
FIG. 3 is a MALDI-MS spectrum of the active ester resin (1) obtained in Synthesis Example 1.
FIG. 4 is a GPC chart of an active ester resin containing a phosphorus atom (1) obtained in Example 1.
FIG. 5 is a GPC chart of an active ester resin containing a phosphorus atom (2) obtained in Example 2.

DESCRIPTION OF EMBODIMENTS

Hereinafter, the present invention will be described in detail.

An active ester resin containing a phosphorus atom of the present invention has Structure (I) in which a structural unit (α) in which a plurality of aromatic nuclei (X) are connected through an alicyclic hydrocarbon group is connected with another structural unit (α) through an arylene dicarbonyloxy group, and at least one of the aromatic nuclei (X) present in the resin has a structural site (Y) represented by any one of the following Structural Formulas (y1) to (y4) as a substituent on the aromatic nucleus.

[Chem. 4]

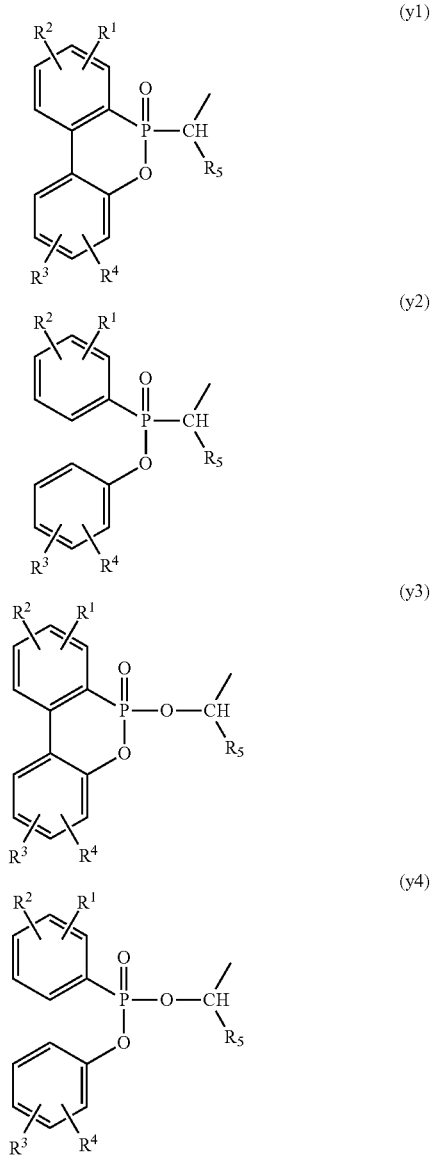

[In Structural Formulas (y1) to (y4), each of $R^1$, $R^2$, $R^3$, and $R^4$ independently represents any one of a hydrogen atom, an alkyl group having 1 to 4 carbon atoms, an alkoxy group having 1 to 4 carbon atoms, a halogen atom, a phenyl group, and an aralkyl group, and $R^5$ represents any one of a hydrogen atom, an alkyl group having 1 to 6 carbon atoms, a phenyl group, a naphthyl group, an anthryl group, a phenyl group having one or more alkyl groups or alkoxy groups having 1 to 4 carbon atoms on an aromatic nucleus thereof, a naphthyl group having one or more alkyl groups or alkoxy groups having 1 to 4 carbon atoms on an aromatic nucleus thereof, an anthryl group having one or more alkyl groups or alkoxy groups having 1 to 4 carbon atoms on an aromatic nucleus thereof, and an aralkyl group.]

In the active ester resin containing a phosphorus atom of the present invention, the arylene dicarbonyloxy group is a so-called active ester group, and since the ester residue blocks the secondary hydroxyl group generated during a curing reaction with an epoxy resin, the dielectric constant and the dielectric tangent of the cured product can be decreased.

In addition, in the active ester resin containing a phosphorus atom of the present invention, the structural site (Y) represented by Structural Formulas (y1) to (y4) contributes to an effect of improving the flame retardancy of a resin since the structural site (Y) contains a phosphorus atom and has a structure having a high aromatic ring concentration. Active ester resins having an alicyclic hydrocarbon group in the molecular structure known in the related art are excellent in dielectric characteristics of the cured product, but the active ester resins are likely to burn and do not have sufficient heat resistance; however, the active ester resin of the present invention has both dielectric characteristics and flame retardancy by introducing the structural site (Y) represented by Structural Formulas (y1) to (y4) in the molecular structure of the active ester resin.

In general, in a resin having a bulky substituent structure as Structural Formulas (y1) to (y4) described above, the heat resistance of the cured product tends to be poor since the active group concentration involved in a curing reaction is decreased, compared to a resin not having such a substituent; however, the active ester resin containing a phosphorus atom of the present invention has not only dielectric characteristics and flame retardancy but also excellent heat resistance, and is a resin material which has various performances.

As the structural unit (α) in which a plurality of the aromatic nuclei (X) are connected through an alicyclic hydrocarbon group, of the active ester resin containing a phosphorus atom of the present invention, a structure obtained by a polyaddition reaction of an unsaturated alicyclic hydrocarbon compound containing two double bonds in one molecule with a phenolic compound is exemplified, and in this case, the aromatic nuclei (X) in an active ester resin containing a phosphorus atom are derived from the phenolic compound.

Examples of the unsaturated alicyclic hydrocarbon compound containing two double bonds in one molecule include dicyclopentadiene, multimers of cyclopentadiene, tetrahydroindene, 4-vinylcyclohexene, 5-vinyl-2-norbornene, and limonene, and these may be used alone respectively, or two or more types thereof may be used in combination. Among these, dicyclopentadiene is preferable since a cured product having high heat resistance can be obtained. Moreover, since dicyclopentadiene is a substance included in petroleum fractions, multimers of cyclopentadiene, or other aliphatic or aromatic diene compounds may be contained in industrial dicyclopentadiene as impurities, and thus, in consideration of performance such as heat resistance, curing properties, formability, and the like, it is desirable to use a product having dicyclopentadiene with a purity of 90% by mass or more.

On the other hand, examples of the phenolic compound include phenol, cresol, xylenol, ethyl phenol, isopropyl phenol, butyl phenol, octylphenol, nonylphenol, vinylphenol, isopropenylphenol, allyl phenol, phenyl phenol, benzyl phenol, chlorophenol, bromophenol, 1-naphthol, 2-naphthol, 1,4-dihydroxynaphthalene, 2,3-dihydroxynaphthalene, 2,3-dihydroxynaphthalene, 2,6-dihydroxynaphthalene, and 2,7-dihydroxynaphthalene, and these may be used alone respectively, or two or more kinds thereof may be used in combination. Among these, phenol is preferable since an active ester resin containing a phosphorus atom which has excellent curing properties is obtained.

The active ester resin containing a phosphorus atom of the present invention has an arylene dicarbonyloxy group as a connecting group of the structural unit (α). Examples of the arylene dicarbonyloxy group include a benzene-1,2-dicarbonyloxy group, a benzene-1,3-dicarbonyloxy group, a benzene-1,4-dicarbonyloxy group, a naphthalene-1,4-dicarbonyloxy group, a naphthalene-2,3-dicarbonyloxy group, a naphthalene-2,6-dicarbonyloxy group, a naphthalene-2,7-dicarbonyloxy group, and an arylene dicarbonyloxy group in which an alkyl group or an alkoxy group having 1 to 4 carbon atoms is substituted on an aromatic nucleus thereof. Among these, a benzene-1,3-dicarbonyloxy group or a benzene-1,4-dicarbonyloxy group is preferable, and a benzene-1,3-dicarbonyloxy group is more preferable, since an active ester resin containing a phosphorus atom which has excellent curing properties is obtained and the production thereof is also easy.

In the active ester resin containing a phosphorus atom of the present invention, at least one of the aromatic nuclei (X) has the structural site (Y) represented by any one of the following Structural Formulas (y1) to (y4) as a substituent on the aromatic nucleus.

[Chem. 5]

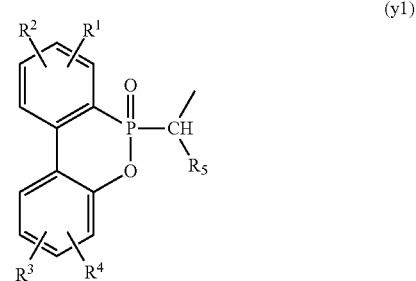

(y1)

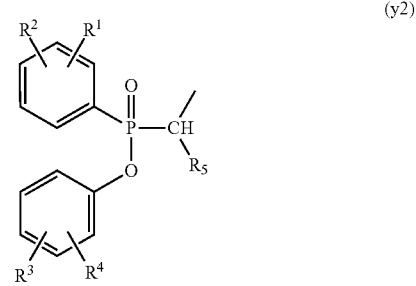

(y2)

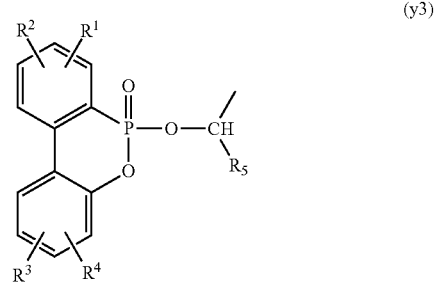

(y3)

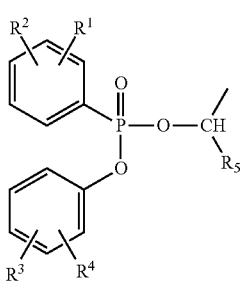

(y4)

[In Structural Formulas (y1) to (y4), each of $R^1$, $R^2$, $R^3$, and $R^4$ independently represents any one of a hydrogen atom, an alkyl group having 1 to 4 carbon atoms, an alkoxy group having 1 to 4 carbon atoms, a halogen atom, a phenyl group, and an aralkyl group, and $R^5$ represents any one of a hydrogen atom, an alkyl group having 1 to 6 carbon atoms, a phenyl group, a naphthyl group, an anthryl group, a phenyl group having one or more alkyl groups or alkoxy groups having 1 to 4 carbon atoms on an aromatic nucleus thereof, a naphthyl group having one or more alkyl groups or alkoxy groups having 1 to 4 carbon atoms on an aromatic nucleus thereof, an anthryl group having one or more alkyl groups or alkoxy groups having 1 to 4 carbon atoms on an aromatic nucleus thereof, and an aralkyl group.]

Among Structural Formulas (y1) to (y4), the structural site represented by Structural Formula (y1) or (y2) is preferable, and the structural site represented by Structural Formula (y1) is particularly preferable, since a cured product which has more excellent flame retardancy and heat resistance can be obtained.

In Structural Formulas (y1) to (y4), all of $R^1$, $R^2$, $R^3$, and $R^4$ are preferably hydrogen atoms since the heat resistance of the cured product is excellent. In addition, in Structural Formulas (y1) to (y4), $R^5$ is preferably any one of a phenyl group, a naphthyl group, an anthryl group, a phenyl group having one or more alkyl groups or alkoxy groups having 1 to 4 carbon atoms on an aromatic nucleus thereof, a naphthyl group having one or more alkyl groups or alkoxy groups having 1 to 4 carbon atoms on an aromatic nucleus thereof, an anthryl group having one or more alkyl groups or alkoxy groups having 1 to 4 carbon atoms on an aromatic nucleus thereof, and more preferably a phenyl group having one or more alkoxy groups on an aromatic nucleus thereof, since a cured product which has excellent flame retardancy and heat resistance is obtained.

More specifically, when the alicyclic hydrocarbon group is indicated as [Z], the aromatic nucleus (X) is indicated as [X], and the arylene dicarbonyloxy group is indicated as [V], the active ester resin containing a phosphorus atom of the present invention can be represented by the following General Formula (1), and

[Chem. 6]

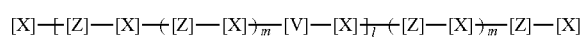

(1)

at least one of [X]'s in General Formula (1) has a molecular structure having the structural site (Y) as a substituent on the aromatic nucleus.

In a case where the structural unit (α) in which a plurality of the aromatic nuclei (X) are connected through an alicyclic hydrocarbon group, of the active ester resin containing a phosphorus atom of the present invention, is a structure obtained by a polyaddition reaction of the unsaturated alicyclic hydrocarbon compound containing two double bonds in one molecule with the phenolic compound, exemplified above, among the plurality of aromatic nuclei (X) in General Formula (1), two aromatic nuclei positioned at a molecular terminal have a phenolic hydroxyl group.

In the active ester resin containing a phosphorus atom of the present invention, among the plurality of aromatic nuclei (X) present in the molecular structure, at least one of two aromatic nuclei positioned at the terminals of Structure (I) preferably has the structural site (Y) represented by any one of Structural Formulas (y1) to (y4) as a substituent on the aromatic nucleus since all performances of the dielectric characteristics, the heat resistance, and the flame retardancy of the cured product become excellent.

In addition, m in General Formula (1) is preferably 0 since an active ester resin containing a phosphorus atom which has excellent solvent solubility is obtained.

Therefore, as a more preferable molecular structure of the active ester resin containing a phosphorus atom of the present invention, specifically, the molecular structure represented by the following Structural Formula (2) is exemplified.

[Chem. 7]

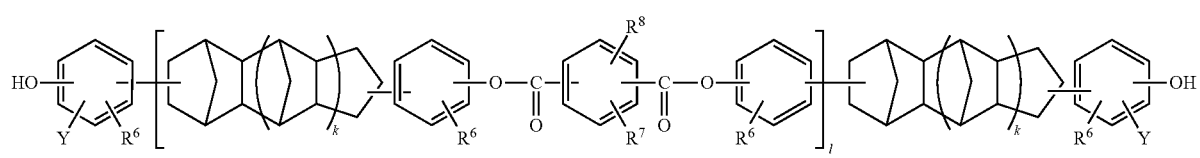

(2)

[In the formula, each of $R^6$, $R^7$, and $R^8$ independently represents any one of a hydrogen atom, an alkyl group having 1 to 4 carbon atoms, an alkoxy group having 1 to 4 carbon atoms, a halogen atom, a phenyl group, and an aralkyl group, Y represents a hydrogen atom or a structural site represented by any one of the following Structural Formulas (y1) to (y4), at least one of two Y's in the molecular structure represents a structural site represented by any one of Structural Formulas (y1) to (y4), k is 0 or 1, and l, which is the average of repeating units, is 0.25 to 1.5.

[Chem. 8]

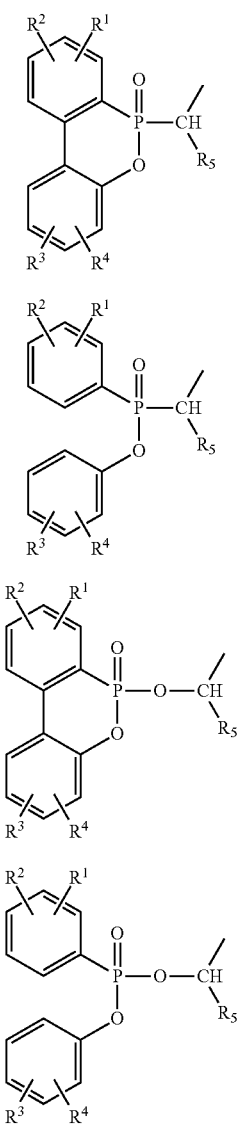

(y1)

(y2)

(y3)

(y4)

{In Structural Formulas (y1) to (y4), each of $R^1$, $R^2$, $R^3$, and $R^4$ independently represents anyone of a hydrogen atom, an alkyl group having 1 to 4 carbon atoms, an alkoxy group having 1 to 4 carbon atoms, a halogen atom, a phenyl group, and an aralkyl group, and $R^5$ represents any one of a hydrogen atom, an alkyl group having 1 to 6 carbon atoms, a phenyl group, a naphthyl group, an anthryl group, a phenyl group having one or more alkyl groups or alkoxy groups having 1 to 4 carbon atoms on an aromatic nucleus thereof, a naphthyl group having one or more alkyl groups or alkoxy groups having 1 to 4 carbon atoms on an aromatic nucleus thereof, an anthryl group having one or more alkyl groups or alkoxy groups having 1 to 4 carbon atoms on an aromatic nucleus thereof, and an aralkyl group.}]

l in Structural Formula (2) represents an average value of repeating units, and l is preferably within a range of 0.25 to 1.5, and more preferably within a range of 0.25 to 1.2, since an active ester resin containing a phosphorus atom which has excellent solubility with respect to various solvents is obtained.

The phosphorus atom content in the active ester resin containing a phosphorus atom of the present invention is preferably within a range of 2.0% by mass to 5.0% by mass, since excellent flame retardancy is obtained.

The softening point of the active ester resin containing a phosphorus atom of the present invention is preferably within a range of 100° C. to 250° C. since the solubility with respect to various organic solvents is high, and all performances of the dielectric characteristics, the heat resistance, and the flame retardancy of the cured product become excellent.

In addition, in a case where the total of an arylcarbonyloxy group and a phenolic hydroxyl group in the resin structure is defined as the number of functional groups of the resin, the active group equivalent of the active ester resin containing a phosphorus atom of the present invention is preferably within a range of 240 g/eq to 450 g/eq, and more preferably within a range of 260 g/eq to 400 g/eq since a cured product which has excellent curing properties, and has a low dielectric constant and a low dielectric tangent is obtained.

For example, the active ester resin containing a phosphorus atom of the present invention can be produced by the following method. That is, a method of performing the production by a step (hereinafter, abbreviated as "Step 1") of obtaining a phenolic resin intermediate (C) by reacting a phenolic compound (A) having a structure in which a plurality of aromatic nuclei having a phenolic hydroxyl group are connected through an alicyclic hydrocarbon group with an aromatic dicarboxylic acid or dihalide thereof (B) in a proportion in which the total of the carboxyl group or an acid halide group contained in the aromatic dicarboxylic acid or the dihalide thereof (B) is within a range of 0.25 moles to 0.75 moles with respect to the total 1 mole of the hydroxyl groups contained in the phenolic compound (A), and by a step (hereinafter, abbreviated as "Step 2") of reacting the phenolic intermediate (C), a aldehyde compound (D), and the compound (E) containing a phosphorus atom represented by any one of the following Structural Formula (e1) or (e2) is exemplified.

[Chem. 9]

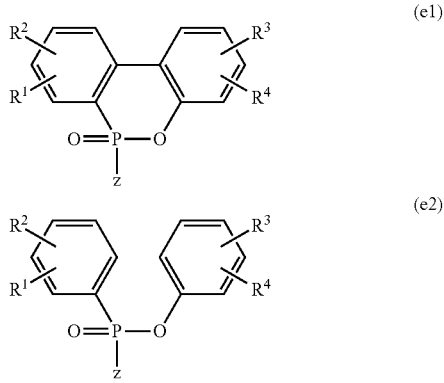

(e1)

(e2)

[In Structural Formula (e1) or (e2), each of $R^1$, $R^2$, $R^3$, and $R^4$ independently represents any one of a hydrogen atom, an alkyl group having 1 to 4 carbon atoms, an alkoxy group having 1 to 4 carbon atoms, a halogen atom, a phenyl group, and an aralkyl group, and z represents a hydrogen atom or a hydroxyl group.]

As the phenolic compound (A) having a structure in which a plurality of aromatic nuclei (X) are connected through an alicyclic hydrocarbon group used in Step 1, a compound obtained by a polyaddition reaction of an unsaturated alicyclic hydrocarbon compound containing two double bonds in one molecule with a phenolic compound is exemplified.

Examples of the unsaturated alicyclic hydrocarbon compound containing two double bonds in one molecule include dicyclopentadiene, multimers of cyclopentadiene, tetrahydroindene, 4-vinylcyclohexene, 5-vinyl-2-norbornene, and limonene, and these may be used alone respectively, or two or more types thereof may be used in combination. Among these, dicyclopentadiene is preferable since a cured product having high heat resistance can be obtained. Moreover, since dicyclopentadiene is a substance included in petroleum fractions, multimers of cyclopentadiene, other aliphatic or aromatic diene compounds may be contained in industrial dicyclopentadiene as impurities, and thus, in consideration of performance such as heat resistance, curing properties, formability, and the like, it is desirable to use a product having dicyclopentadiene with a purity of 90% by mass or more.

On the other hand, examples of the phenolic compound include phenol, cresol, xylenol, ethyl phenol, isopropyl phenol, butyl phenol, octyl phenol, nonyl phenol, vinyl phenol, isopropenyl phenol, allyl phenol, phenyl phenol, benzyl phenol, chlorophenol, bromophenol, 1-naphthol, 2-naphthol, 1,4-dihydroxynaphthalene, 2,3-dihydroxynaphthalene, 2,3-dihydroxynaphthalene, 2,6-dihydroxynaphthalene, and 2,7-dihydroxynaphthalene, and these may be used alone respectively, or two or more kinds thereof may be used in combination. Among these, phenol is preferable since an active ester resin containing a phosphorus atom having excellent curing properties is obtained.

On the other hand, examples of the aromatic dicarboxylic acid or the halide thereof (B) used in Step 1 include isophthalic acid, terephthalic acid, naphthalene-1,4-dicarboxylic acid, naphthalene-2,3-dicarboxylic acid, naphthalene-2,6-dicarboxylic acid, naphthalene-2,7-dicarboxylic acid, acid fluorides, acid chlorides, acid bromides, and acid iodides thereof, and a compound substituted with an alkyl group or an alkoxy group having 1 to 4 carbon atoms on the aromatic nucleus thereof. Among these, dichloride of isophthalic acid or dichloride of terephthalic acid is preferable, and dichloride of isophthalic acid is more preferable since the reactivity with the phenolic compound (A) is excellent, and an active ester resin containing a phosphorus atom which has excellent curing properties is obtained.

For example, Step 1 can be performed at temperature conditions of 40° C. to 65° C. in the presence of an alkali catalyst. Examples of the alkali catalyst capable of being used here include sodium hydroxide, potassium hydroxide, triethylamine, and pyridine. Among these, sodium hydroxide or potassium hydroxide is preferable since the reaction efficiency is high. In addition, these catalysts may be used as an aqueous solution of 3.0% to 30%.

Step 1 is preferably performed in an organic solvent since the control of the reaction is easy. Examples of the organic solvent used here include ketone solvents such as acetone, methyl ethyl ketone, and cyclohexanone, acetic acid ester solvents such as ethyl acetate, butyl acetate, cellosolve acetate, propylene glycol monomethyl ether acetate, and carbitol acetate, carbitol solvents such as cellosolve and butyl carbitol, aromatic hydrocarbon solvents such as toluene and xylene, dimethylformamide, dimethylacetamide, and N-methylpyrrolidone.

After Step 1 ends, in the case of using an aqueous solution of an alkali catalyst, the phenolic resin intermediate (C) can be obtained by leaving the reaction solution to stand for liquid-liquid separation, removing the aqueous layer, washing the remaining organic layer with water, and repeating washing with water until the aqueous layer became substantially neutral.

More specifically, when the alicyclic hydrocarbon group is indicated as [Z], the aromatic nucleus (X) is indicated as [X], and the arylene dicarbonyloxy group is indicated as [V], the phenolic resin intermediate (C) obtained in this manner can be represented by the following General Formula (1), and

[Chem. 10]

(1)

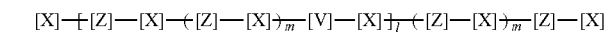

the value of 1 in General Formula (1) can be obtained in the following manner.

[Method of Determining Value of 1 in Structural Formula (1)]

The ratio ($\beta1/\alpha1$, $\beta2/\alpha2$, $\beta3/\alpha3$, and $\beta4/\alpha4$) between the value of the molecular weight ($\alpha1$, $\alpha2$, $\alpha3$, and $\alpha4$) in terms of styrene corresponding to each of l=1, l=2, l=3, and l=4 obtained by a GPC measurement under the following conditions and a theoretical molecular weight ($\beta1$, $\beta2$, $\beta3$, and $\beta4$) of each of l=1, l=2, l=3, and l=4 is determined, and the average value of these ($\beta1/\alpha1$ to $\beta4/\alpha4$) is determined. The value obtained by multiplying the number average molecular weight (Mw) obtained as the result of the GPC measurement by this average value is taken as an average molecular weight, and the value of 1 corresponding to the average molecular weight is calculated.

(GPC Measurement Conditions)

Measuring apparatus: "HLC-8220 GPC" manufactured by Tosoh Corporation

Column: guard column "HXL-L" manufactured by Tosoh Corporation

+"TSK-GEL G2000HXL" manufactured by Tosoh Corporation

+"TSK-GEL G2000HXL" manufactured by Tosoh Corporation

+"TSK-GEL G3000HXL" manufactured by Tosoh Corporation

+"TSK-GEL G4000HXL" manufactured by Tosoh Corporation

Detector: RI (differential refractometer)

Data processing: "GPC-8020 model II Version 4.10" manufactured by Tosoh Corporation Measurement conditions: column temperature 40° C.

eluent tetrahydrofuran flow rate 1.0 ml/min

Standard: according to the measurement manual of the "GPC-8020 model II Version 4.10", the following monodisperse polystyrene of which the molecular weight is known is used.

(Polystyrene Used)

"A-500" manufactured by Tosoh Corporation

"A-1000" manufactured by Tosoh Corporation

"A-2500" manufactured by Tosoh Corporation

"A-5000" manufactured by Tosoh Corporation

"F-1" manufactured by Tosoh Corporation

"F-2" manufactured by Tosoh Corporation

"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: a solution (50 μl) obtained by filtering a tetrahydrofuran solution of 1.0% by mass in terms of the resin solid content through a microfilter.

The value of 1 determined here is the same as the value of 1 in Structural Formula (2) which is an specific example of the active ester resin containing a phosphorus atom of the present invention, and the value of 1 is preferably within a range of 0.25 to 1.5, and more preferably within a range of 0.25 to 1.2, since an active ester resin containing a phosphorus atom which has excellent solubility with respect to various solvents is obtained.

In subsequent Step 2, the phenolic resin intermediate (C) obtained in Step 1, the aldehyde compound (D), and the compound (E) containing a phosphorus atom represented by any one of the following Structural Formula (e1) or (e2) are reacted.

[Chem. 11]

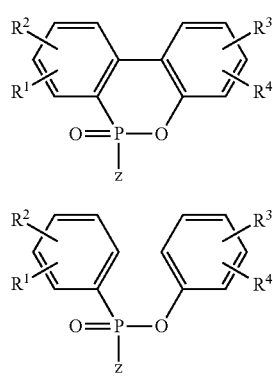

[In Structural Formula (e1) or (e2), each of $R^1$, $R^2$, $R^3$, and $R^4$ independently represents anyone of a hydrogen atom, an alkyl group having 1 to 4 carbon atoms, an alkoxy group having 1 to 4 carbon atoms, a halogen atom, a phenyl group, and an aralkyl group, and z represents a hydrogen atom or a hydroxyl group.]

In Step 2, the reaction proportion of the phenolic resin intermediate (C), the aldehyde compound (D), and the compound (E) containing a phosphorus atom is preferably a proportion in which the aromatic aldehyde compound (D) is within a range of 0.1 moles to 0.7 moles, and the compound (E) containing a phosphorus atom is within a range of 0.1 moles to 0.7 moles with respect to 1 mole of the hydroxyl groups contained in the phenolic resin intermediate (C) since an active ester resin containing a phosphorus atom capable of providing a cured product which is excellent in all performances of the dielectric characteristics, the heat resistance, and the flame retardancy is obtained. Furthermore, the reaction proportion is more preferably a proportion in which the aldehyde compound (D) is within a range of 0.2 moles to 0.6 moles, and the compound (E) containing a phosphorus atom is within a range of 0.2 moles to 0.6 moles with respect to 1 mole of the hydroxyl groups contained in the phenolic resin intermediate (C).

Examples of the aldehyde compound (D) used in Step 2 include aldehyde compounds having an alkoxy group as a substituent of aromatic aldehydes such as formaldehyde, acetaldehyde, propionaldehyde, butyl aldehyde, pentyl aldehyde, hexyl aldehyde, cyclohexyl aldehyde, benzaldehyde, o-tolualdehyde, p-tolualdehyde, o-ethyl aldehyde, p-ethyl aldehyde, p-isopropyl aldehyde, naphthaldehyde, anthracene aldehyde, and phenyl acetaldehyde. Among these, aromatic aldehyde having an alkoxy group on the aromatic nucleus is preferable, and, specifically, the aromatic aldehyde compound represented by the following Structural Formula (d1) or (d2) is preferable since an active ester resin containing a phosphorus atom capable of providing a cured product which has excellent heat resistance is obtained.

[Chem. 12]

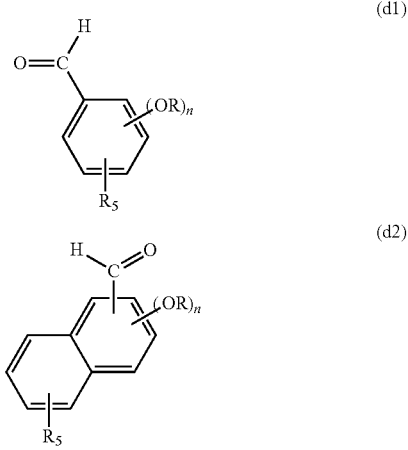

(In the formulas, R represents an alkyl group having 1 to 4 carbon atoms, $R^5$ represents a hydrogen atom or an alkyl group having 1 to 4 carbon atoms, and n is the number of the substituent OR's on the aromatic nucleus and is an integer of 1 to 3.)

Among these, para-anisaldehyde in which the value of n is 1, R is a methyl group, and $R^5$ is a hydrogen atom in Structural Formula (d1) is preferable since the reactivity of the para-anisaldehyde with the phenolic resin intermediate (C) which is another reaction raw material or the compound (E) containing a phosphorus atom is excellent.

On the other hand, the compound (E) containing a phosphorus atom used in Step 2 is a compound represented by Structural Formula (e1) or (e2). Among these, 9,10-dihydro-9-oxa-10-phosphaphenanthrene-10-oxide, in which all of $R^1$, $R^2$, $R^3$, and $R^4$ are hydrogen atoms and z is a hydrogen atom in Structural Formula (e1), is preferable since the reactivity of the 9,10-dihydro-9-oxa-10-phosphaphenanthrene-10-oxide with the phenolic resin intermediate (C) which is another reaction raw material or the aromatic aldehyde (D) is excellent.

For example, Step 2 can be performed at temperature conditions of 140° C. to 200° C. in the absence of a catalyst or in the presence of an acid catalyst. The reaction performed in Step 2 has high reactivity and sufficiently proceeds even under non-catalytic conditions, but the reaction may be performed by using an acid catalyst, as necessary, and specific examples of the acid catalyst include inorganic acids such as hydrochloric acid, sulfuric acid, and phosphoric acid, organic acids such as methanesulfonic acid, p-toluenesulfonic acid, and oxalic acid, and Lewis acids such as boron trifluoride, anhydrous aluminum chloride, and zinc chloride. In the case of using the acid catalyst, the acid catalyst is preferably used in the amount of 5.0% by mass or less with respect to the total mass of the reaction raw materials.

In addition, the reaction of Step 2 is typically performed in solvent-free conditions; however, the reaction may be performed in an organic solvent, as necessary. Examples of the organic solvent used here include ketone solvents such as acetone, methyl ethyl ketone, and cyclohexanone, acetic acid ester solvents such as ethyl acetate, butyl acetate, cellosolve acetate, propylene glycol monomethyl ether acetate, and carbitol acetate, carbitol solvents such as cellosolve and butyl carbitol, aromatic hydrocarbon solvents such as toluene and xylene, dimethylformamide, dimethylacetamide, and N-methylpyrrolidone.

After Step 2 ends, it is possible to obtain a desired active ester resin containing a phosphorus atom by removing water by heating under reduced pressure or the like.

The epoxy resin composition of the present invention contains the above-described active ester resin containing a phosphorus atom and an epoxy resin as essential components.

Examples of the epoxy resin used in the present invention include a bisphenol A type epoxy resin, a bisphenol F type epoxy resin, a biphenyl type epoxy resin, a tetramethyl biphenyl type epoxy resin, a polyhydroxy naphthalene type epoxy resin, a phenol novolak type epoxy resin, a cresol novolak type epoxy resin, a triphenyl methane type epoxy resin, a tetraphenyl ethane type epoxy resin, dicyclopentadiene-phenol addition reaction type epoxy resin, a phenol aralkyl type epoxy resin, a naphthol novolak type epoxy resin, a naphthol aralkyl type epoxy resin, a naphthol-phenol co-condensed novolak type epoxy resin, a naphthol-cresol co-condensed novolak type epoxy resin, an aromatic hydrocarbon formaldehyde resin-modified phenolic resin type epoxy resin, and a biphenyl-modified novolak type epoxy resin. Among these epoxy resins, from the viewpoint of obtaining a cured product having particularly excellent flame retardancy, a tetramethyl biphenol type epoxy resin, a biphenyl aralkyl type epoxy resin, a polyhydroxynaphthalene type epoxy resin, or a novolak type epoxy resin is preferably used, and from the viewpoint of obtaining a cured product having excellent dielectric characteristics, a dicyclopentadiene-phenol addition reaction type epoxy resin is preferable.

In the epoxy resin composition of the present invention, the blending amount of the active ester resin containing a phosphorus atom and the epoxy resin is preferably a proportion in which the epoxy groups in the expoxy resin is 0.8 equivalents to 1.2 equivalents with respect to total 1 equivalent of the active groups in the active ester resin containing a phosphorus atom since a cured product which has excellent curing properties, and has a low dielectric constant and a low dielectric tangent is obtained. Here, the active group in the active ester resin containing a phosphorus atom refers to an arylcarbonyloxy group and a phenolic hydroxyl group contained in a resin structure.

In the epoxy resin composition of the present invention, the active ester resin containing a phosphorus atom and other curing agents may be used in combination. Examples of other curing agents used here include amine compounds such as diaminodiphenyl methane, diethylenetriamine, triethylenetetramine, diaminodiphenyl sulfone, isophoronediamine, imidazole, a $BF_3$-amine complex, and guanidine derivatives; amide compounds such as dicyandiamide and a polyamide resin synthesized from a dimer of linolenic acid and ethylenediamine; acid anhydrides such as phthalic anhydride, trimellitic anhydride, pyromellitic anhydride, maleic anhydride, tetrahydrophthalic anhydride, methyl tetrahydrophthalic anhydride, methylnadic anhydride, hexahydrophthalic anhydride, and methylhexahydrophthalic anhydride; and polyvalent phenolic compounds such as a phenol novolak resin, a cresol novolak resin, an aromatic hydrocarbon formaldehyde resin-modified phenolic resin, a dicyclopentadiene phenol adduct type resin, a phenol aralkyl resin, a naphthol aralkyl resin, a trimethylol methane resin, a tetraphenylol ethane resin, a naphthol novolak resin, a naphthol-phenol co-condensed novolak resin, a naphthol-cresol co-condensed novolak resin, a biphenyl-modified phenolic resin (polyvalent phenolic compound to which a phenolic nucleus is linked by a bismethylene group), a biphenyl-modified naphthol resin (polyvalent naphthol compound to which a phenolic nucleus is linked by a bismethylene group), and an aminotriazine-modified phenolic resin (polyvalent phenolic compound to which a phenolic nucleus is linked by melamine, benzoguanamine, or the like).

Among these, a curing agent including many aromatic skeletons in the molecular structure is preferable since it has excellent dielectric characteristics and moisture absorption resistance, and specifically, a phenol novolak resin, a cresol novolak resin, an aromatic hydrocarbon formaldehyde resin-modified phenolic resin, a phenol aralkyl resin, a naphthol aralkyl resin, a naphthol novolak resin, a naphthol-phenol co-condensed novolak resin, a naphthol-cresol co-condensed novolak resin, a biphenyl-modified phenolic resin, a biphenyl-modified naphthol resin, or aminotriazine-modified phenolic resin is preferable.

In the case of using other curing agents described above in combination, the amount used thereof is preferably within a range of 10% by mass to 50% by mass in the total 100 parts by mass of the active ester resin containing a phosphorus atom and other curing agents.

The epoxy resin composition of the present invention may contain a curing promoter, as necessary. Examples of the curing promoter used here include phosphorus-based compounds, tertiary amines, imidazoles, organic acid metal salts, Lewis acids, and amine complex salts. In particular, in the case of using the epoxy resin composition of the present invention as build-up material applications or circuit board applications, dimethylaminopyridine or imidazole is preferable since heat resistance, dielectric characteristics, and solder resistance thereof are excellent.

In the case of using the epoxy resin composition of the present invention as build-up material applications or circuit board applications, examples of the organic solvent used in varnishing include ketone solvent such as acetone, methyl ethyl ketone, and cyclohexanone, acetic acid ester solvents such as ethyl acetate, butyl acetate, cellosolve acetate, propylene glycol monomethyl ether acetate, and carbitol acetate, alcohol solvents such as ethanol, propanol, and butanol, carbitol solvents such as cellosolve and butyl carbitol, dimethyl formamide, dimethylacetamide, and N-methylpyrrolidone, in addition to aromatic hydrocarbon solvents such as toluene and xylene.

In the case of using the epoxy resin composition of the present invention for applications of printed wiring board applications, a polar solvent having a boiling point of 160° C. or lower, such as methyl ethyl ketone, acetone, or 1-methoxy-2-propanol is preferable, and the solvent is preferably used in a proportion in which the non-volatile content becomes 40% by mass to 80% by mass. On the other hand, in the use for applications of an adhesive film for build-up, ketone solvents such as acetone, methyl ethyl ketone, and cyclohexanone, acetic acid ester solvents such as ethyl acetate, butyl acetate, cellosolve acetate, propylene glycol monomethyl ether acetate, and carbitol acetate, alcohol solvents such as ethanol, propanol, and butanol, carbitol solvents such as cellosolve and butyl carbitol, dimethylformamide, dimethylacetamide, or N-methylpyrrolidone is preferably used, and the solvents are preferably used in a proportion in which the non-volatile content becomes 30% by mass to 60% by mass.

In addition, in the epoxy resin composition of the present invention, other thermosetting resins are suitably used in combination, as necessary. Examples of other thermosetting resins capable of being used here include a cyanate ester compound, a vinylbenzyl compound, an acrylic compound, a maleimide compound, and a copolymer of styrene and maleic anhydride. In the case of using other thermosetting resins described above in combination, the amount used thereof is not particularly limited as long as it is within a range not interfering with the effects of the present invention, and is preferably within a range of 1 part by weight to 50 parts by weight in 100 parts by mass of the epoxy resin composition.

In the case of using the epoxy resin composition of the present invention in applications requiring higher flame retardancy, such as printed wiring board applications, a non-halogen-based flame retardant which substantially does not contain a halogen atom may be blended.

Examples of the non-halogen-based flame retardant include a phosphorus-based flame retardant, a nitrogen-based flame retardant, a silicone-based flame retardant, an inorganic flame retardant, and an organometallic salt-based flame retardant, and there is no limitation for using these, these may be used alone, or a plurality of the same types of flame retardant may be used and the different types of flame retardant may also be used in combination.

As the phosphorus-based flame retardant, both of an inorganic flame retardant and an organic flame retardant can be used. Examples of the inorganic compound include inorganic nitrogen-containing phosphorus compounds such as red phosphorus, ammonium phosphates including monoammonium phosphate, diammonium phosphate, triammonium phosphate, and ammonium polyphosphate, and phosphoric amides.

In addition, the red phosphorus is preferably subjected to a surface treatment for the purpose of preventing hydrolysis or the like, and examples of the surface treatment method include (i) a method for coat-treating with an inorganic compound such as magnesium hydroxide, aluminum hydroxide, zinc hydroxide, titanium hydroxide, bismuth oxide, bismuth hydroxide, bismuth nitrate, or a mixture thereof, (ii) a method for coat-treating with a mixture of an inorganic compound such as magnesium hydroxide, aluminum hydroxide, zinc hydroxide, or titanium hydroxide, and a thermosetting resin such as a phenolic resin, and (iii) a method for doubly coat-treating the surface of a coated film of an inorganic compound such as magnesium hydroxide, aluminum hydroxide, zinc hydroxide, or titanium hydroxide with a thermosetting resin such as a phenolic resin.

Examples of the organic phosphorus-based compound include general-purpose organic phosphorus-based compounds such as a phosphoric acid ester compound, a phosphonic acid compound, a phosphinic acid compound, a phosphine oxide compound, a phosphorane compound, and an organic nitrogen-containing phosphorus compound, and cyclic organic phosphorus compounds such as 9,10-dihydro-9-oxa-10-phosphaphenanthrene-10-oxide, 10-(2,5-dihydrooxyphenyl)-10H-9-oxa-10-phosphaphenanthrene-10-oxide, and 10-(2,7-dihydrooxynaphthyl)-10H-9-oxa-10-phosphaphenanthrene-10-oxide, and derivatives obtained by reacting the cyclic organic phosphorus compound with a compound such as an epoxy resin or a phenolic resin.

The blending amount of the phosphorus-based flame retardant, for example, is preferably within a range of 0.1 parts by mass to 2.0 parts by mass in 100 parts by mass of the epoxy resin composition in the case of using red phosphorus, and preferably within a range of 0.1 parts by mass to 10.0 parts by mass and more preferably within a range of 0.5 parts by mass to 6.0 parts by mass in 100 parts by mass of the epoxy resin composition in the case of using an organic phosphorus compound.

In addition, in the case of using the phosphorus-based flame retardant, the phosphorus-based flame retardant may be used in combination with hydrotalcite, magnesium hydroxide, a boron compound, zirconium oxide, black dye, calcium carbonate, zeolite, zinc molybdate, or activated charcoal.

Examples of the nitrogen-based flame retardant include a triazine compound, a cyanuric acid compound, an isocyanuric acid compound, and phenothiazine, and the triazine compound, the cyanuric acid compound, or the isocyanuric acid compound is preferable.

Examples of the triazine compound include aminotriazine sulfate compounds such as guanyl melamine sulfate, melem sulfate, and melam sulfate, an aminotriazine-modified phenolic resin, and a product obtained by further modifying the aminotriazine-modified phenolic resin with tung oil or isomerized linseed oil, in addition to melamine, acetoguanamine, benzoguanamine, melon, melam, succinoguanamine, ethylene melamine, melamine polyphosphate, and triguanamine.

Examples of the cyanuric acid compound can include cyanuric acid and melamine cyanurate.

The blending amount of the nitrogen-based flame retardant, for example, is preferably within a range of 0.05 parts by mass to 10 parts by mass, and more preferably within a range of 0.1 parts by mass to 5 parts by mass, in 100 parts by mass of the epoxy resin composition.

In addition, when using the nitrogen-based flame retardant, metal hydroxide or a molybdenum compound may be used in combination.

The silicone-based flame retardant can be used without any particular limitation as long as the silicone-based flame retardant is an organic compound containing a silicon atom, and examples thereof include silicone oil, silicone rubber, and silicone resins.

The blending amount of the silicone-based flame retardant, for example, is preferably within a range of 0.05 parts by mass to 20 parts by mass in 100 parts by mass of the epoxy resin composition. In addition, when using the silicone-based flame retardant, a molybdenum compound or alumina may be used in combination.

Examples of the inorganic flame retardant include metal hydroxides, metal oxides, metal carbonate compounds, metal powder, boron compounds, and low melting point glass.

Examples of the metal hydroxide can include aluminum hydroxide, magnesium hydroxide, dolomite, hydrotalcite, calcium hydroxide, barium hydroxide, and zirconium hydroxide.

Examples of the metal oxide can include zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Examples of the metal carbonate compound can include zinc carbonate, magnesium carbonate, calcium carbonate, barium carbonate, basic magnesium carbonate, aluminum carbonate, iron carbonate, cobalt carbonate, and titanium carbonate.

Examples of the metal powder can include aluminum powder, iron powder, titanium powder, manganese powder, zinc powder, molybdenum powder, cobalt powder, bismuth powder, chromium powder, nickel powder, copper powder, tungsten powder, and tin powder.

Examples of the boron compound can include zinc borate, zinc metaborate, barium metaborate, boric acid, and borax.

Examples of the low melting point glass can include glass-like compounds such as a Ceepree (Bokusui Brown Co., Ltd.) glass, a hydrated glass $SiO_2$—$MgO$—$H_2O$, $PbO$—$B_2O_3$-based glass, a $ZnO$—$P_2O_5$—$MgO$-based glass, a $P_2O_5$—$B_2O_3$—$PbO$—$MgO$-based glass, a P—Sn—O—F-based glass, a $PbO$—$V_2O_5$—$TeO_2$-based glass, an $Al_2O_3$—$H_2O$-based glass, and lead borosilicate-based glass.

The blending amount of the inorganic flame retardant, for example, is preferably within a range of 0.05 parts by mass to 20 parts by mass, and more preferably within a range of 0.5 parts by mass to 15 parts by mass, in 100 parts by mass of the epoxy resin composition.

Examples of the organometallic salt-based flame retardant include ferrocene, an acetylacetonate metal complex, an organometallic carbonyl compound, an organic cobalt salt compound, an organic sulfonic acid metal salt, and a compound obtained by an ionic bond or a coordination bond of a metal atom to an aromatic compound or a heterocyclic compound.

The blending amount of the organometallic salt-based flame retardant, for example, is preferably within a range of 0.005 parts by mass to 10 parts by mass in 100 parts by mass of the epoxy resin composition.

In the epoxy resin composition of the present invention, an inorganic filler can be blended, as necessary. Examples of the inorganic filler include fused silica, crystalline silica, alumina, silicon nitride, and aluminum hydroxide. In a case where the blending amount of the inorganic filler is particularly large, fused silica is preferably used. The fused silica can be used in any one of a crushed shape or a spherical shape; however, in order to increase the blending amount of the fused silica and to suppress increase in melt viscosity of a molding material, spherical silica is preferably mainly used. Furthermore, in order to increase the blending amount of the spherical silica, the particle size distribution of the spherical silica is preferably suitably adjusted. The filling ratio is preferably higher in consideration of flame retardancy, and particularly preferably 20% by mass or greater with respect to the total amount of the thermosetting resin composition. In addition, in the case of use in applications such as a conductive paste, it is possible to use a conductive filler such as silver powder or copper powder.

In addition, various compounding agents such as a silane coupling agent, a release agent, a pigment, and an emulsifier can be added to the epoxy resin composition of the present invention, as necessary.

The epoxy resin composition of the present invention is obtained by uniformly mixing the respective components described above, and can be a cured product with ease by the same methods as methods of curing epoxy resin compositions known in the related art. Examples of the cured product include molded cured products such as a laminate, a cast product, an adhesive layer, a coating film, and a film.

The epoxy resin composition of the present invention can be suitably used in various electronic material applications such as insulating materials for circuit boards such as a hard printed wiring board material, a resin composition for flexible wiring boards, and an interlayer insulating material for build-up substrates, and a semiconductor sealing material, a conductive paste, an adhesive film for build-up, a resin casting material, and an adhesive since the dielectric constant and the dielectric tangent of the cured product thereof are low, and heat resistance and flame retardancy are also excellent. Among these, the epoxy resin composition can be particularly preferably used in materials for circuit boards such as a hard printed wiring board material, a resin composition for flexible wiring boards, and an interlayer insulating material for build-up substrates, by taking advantage of high solubility of the active ester resins of the present invention in various organic solvents.

In the case of applying the epoxy resin composition to circuit board applications among these, a circuit board can be produced by diluting the epoxy resin composition of the present invention with an organic solvent to obtain a varnish, forming the varnish into a plate shape and laminating the vanish and copper foil, and heat and pressure-molding the resultant product. In addition, in the case of applying the epoxy resin composition to hard printed wiring board applications, a hard printed wiring board can be produced by a method in which a prepreg is obtained by impregnating a reinforcement basic material with a varnish-like epoxy resin composition including an organic solvent and by semi-curing the obtained impregnated basic material, a copper foil is overlapped thereon, and the resultant product is heat-pressed. Examples of the reinforcement basic material capable of being used here include paper, glass cloth, glass nonwoven fabric, aramid paper, aramid cloth, glass mat, and glass roving cloth. In describing the method in more detail, first, the varnish-like epoxy resin composition described above is heated at a heating temperature according to the solvent species used, preferably 50° C. to 170° C., whereby a prepreg which is a cured product is obtained. At this time, the mass proportion between the thermosetting resin composition and the reinforcement basic material used is not particularly limited; however, typically, the prepreg is preferably prepared such that the resin content in the prepreg becomes 20% by mass to 60% by mass. Next, the prepreg obtained in the above manner is laminated by an ordinary method, then, copper foil is suitably overlapped thereon, and the resultant product is heat-pressed at 170° C. to 250° C. for 10 minutes to 3 hours under a pressure of 1 MPa to 10 MPa, whereby a desired circuit board is obtained.

In order to produce a flexible wiring board from the epoxy resin composition of the present invention, an epoxy resin composition blended with an organic solvent is applied to an electrical insulating film using a coater such as a reverse roll coater or a comma coater. Next, the resultant product is heated at 60° C. to 170° C. for 1 minute to 15 minutes using a heater, and the solvent was evaporated, whereby the epoxy resin composition is B-staged. Next, metal foil is thermo-compression-bonded to the resin composition layer using a heating roll or the like. The compression pressure at this time is preferably 2 N/cm to 200 N/cm, and the compression temperature is preferably 40° C. to 200° C. If sufficient adhesive performance is obtained, the process may be stopped here; however, in a case where complete cure is needed, postcuring is preferably further performed at 100° C. to 200° C. for 1 hour to 24 hours. The thickness of the resin composition layer after being finally cured is preferably within a range of 5 µm to 100 µm.

In order to produce an interlayer insulating material for build-up substrate from the epoxy resin composition of the present invention, for example, an epoxy resin composition suitably blended with rubber, a filler, and the like is applied to a wiring board on which circuits are formed using a spray coating method or a curtain coating method, and then, cured. Thereafter, after punching of a predetermined through-hole portion or the like is performed as necessary, irregularities are formed by treated with a roughening agent and by rinsing the surface with hot water, and the resultant product is subjected to a plating treatment with a metal such as copper. As the plating method described above, electroless plating or electroplating is preferable, and examples of the roughening agent include an oxidant, alkali, and an organic solvent. It is possible to obtain a build-up substrate by sequentially repeating such operations as desired and by alternately building-up a resin insulating layer and a conductor layer of a predetermined circuit pattern. Here, punching of a through-hole portion is performed after the resin insulating layer which is the outermost layer is formed. In addition, it is also possible to produce a build-up substrate by heat-pressing resin-applied copper foil obtained by semi-curing the resin composition on copper foil on a circuit board on which circuits are formed at 170° C. to 250° C. to form a roughened surface, without performing a step of a plating treatment.

As a method of producing an adhesive film for build-up from the epoxy resin composition of the present invention, a method of forming an adhesive film for a multilayer printed wiring board by applying the epoxy resin composition of the present invention to a supporting film to form a resin composition layer is exemplified.

In the case of using the epoxy resin composition of the present invention in the adhesive film for build-up, it is essential that the adhesive film is softened under temperature conditions (typically, 70° C. to 140° C.) of laminating in the vacuum lamination method, and exhibits fluidity (resin flow) at which via holes or through-holes present in the circuit board can be filled with a resin simultaneously with laminating of the circuit board, and it is preferable to blend the above respective components so as to express such characteristics.

Here, the diameter of the through-hole of the multilayer printed wiring board is typically 0.1 mm to 0.5 mm, the depth is typically 0.1 mm to 1.2 mm, and, typically, it is preferable to make filling with the resin possible within this range. Moreover, in the case of laminating both surfaces of the circuit board, it is desirable for the through-hole to be approximately half-filled with the resin.

The adhesive film described above, specifically, can be produced by a method in which a varnish-like epoxy resin composition of the present invention is prepared, the varnish-like composition is applied to the surface of a supporting film, the organic solvent is dried by heating or blowing hot air, and as a result, a layer ($\alpha$) of the epoxy resin composition is formed.

Typically, the layer ($\alpha$) is formed to have a thickness equal to or greater than the thickness of the conductor layer. Since the thickness of the conductor layer of the circuit board is typically within a range of 5 µm to 70 µm, the thickness of the resin composition layer preferably has a thickness of 10 µm to 100 µm.

Moreover, the layer ($\alpha$) may be protected with a protective film described later. By being protected with a protective film, it is possible to prevent adhesion of dust or the like to the resin composition layer surface or scratches thereon.

Examples of the supporting film and the protective film can include polyolefins such as polyethylene, polypropylene, and polyvinyl chloride, polyesters such as polyethylene terephthalate (hereinafter, abbreviated as "PET" in some cases) and polyethylene naphthalate, polycarbonate, polyimide, release paper, and metal foil such as copper foil and aluminum foil. Moreover, the supporting film and the protective film may be subjected to a release treatment, in addition to a matting treatment and a corona treatment.

The thickness of the supporting film is not particularly limited, is typically within a range of 10 µm to 150 µm, and preferably within a range of 25 µm to 50 µm. In addition, the thickness of the protective film is preferably within a range of 1 µm to 40 µm.

The supporting film is peeled off after laminating on a circuit board or after forming an insulating layer by heat-curing. When the supporting film is peeled off after heat-curing the adhesive film, it is possible to prevent adhesion of dust or the like in the curing step. In the case of peeling off after curing, typically, the supporting film is subjected to a release treatment in advance.

Next, in a method for producing a multilayer printed wiring board using the adhesive film obtained in the above manner, for example, in a case where the layer ($\alpha$) is protected with a protective film, after peeling off the protective film, the layer ($\alpha$) is laminated on one or both sides of the circuit board so as to be in direct contact with the circuit board, for example, by a vacuum lamination method. The lamination method may be a batch type or may be a continuous type by a roll. In addition, before performing the lamination, the adhesive film and the circuit board may be heated (preheated), as necessary.

As the lamination conditions, the compression temperature (lamination temperature) is preferably 70° C. to 140° C., the compression pressure is preferably 1 kgf/cm$^2$ to 11 kgf/cm$^2$ (9.8×10$^4$ N/m$^2$ to 107.9×10$^4$ N/m$^2$), and it is preferable to perform lamination under reduced pressure of air pressure of 20 mmHg (26.7 hPa) or less.

In the case of using the epoxy resin composition of the present invention as a conductive paste, a method of producing a composition for anisotropic conductive films by dispersing fine conductive particles in the epoxy resin composition and a method of producing a paste resin composition for circuit connection or an anisotropic conductive adhesive which is a liquid at room temperature are exemplified.

In addition, the epoxy resin composition of the present invention can also be used as a resist ink. In this case, a method in which a composition for resist inks is obtained by blending, in the epoxy resin composition, a vinyl monomer having an ethylenically unsaturated double bond and a cationic polymerization catalyst as a curing agent and by adding a pigment, talc, and a filler thereto, the composition is applied to a printed board by a screen printing method, and as a result, a resist ink cured product is obtained is exemplified.

EXAMPLES

Hereinafter, the present invention will be more specifically described using examples and comparative examples, and "parts" and "%" below are based on mass unless otherwise specifically indicated. Moreover, a softening point, GPC, $^{13}$C-NMR, an MALDI-MS spectrum were measured under the following conditions.

Softening point measurement method: based on JIS K7234.

GPC: the measurement was performed under the following conditions.

Measuring apparatus: "HLC-8220 GPC" manufactured by Tosoh Corporation

Column: guard column "HXL-L" manufactured by Tosoh Corporation

+"TSK-GEL G2000HXL" manufactured by Tosoh Corporation

+"TSK-GEL G2000HXL" manufactured by Tosoh Corporation

+"TSK-GEL G3000HXL" manufactured by Tosoh Corporation

+"TSK-GEL G4000HXL" manufactured by Tosoh Corporation

Detector: RI (differential refractometer)

Data processing: "GPC-8020 model II Version 4.10" manufactured by Tosoh Corporation Measurement conditions: column temperature 40° C.

eluent tetrahydrofuran flow rate 1.0 ml/min

Standard: according to the measurement manual of the "GPC-8020 model II Version 4.10", the following monodisperse polystyrene of which the molecular weight is known is used.

(Polystyrene Used)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: a solution (50 μl) obtained by filtering a tetrahydrofuran solution of 1.0% by mass in terms of the resin solid content through a microfilter.

$^{13}$C-NMR: measurement was performed by using "JNM-ECA500" manufactured by JEOL Ltd.

MALDI-MS: measurement was performed by using "AXIMA-TOF2" manufactured by Shimadzu Corporation.

Preparation Example 1

Preparation of Phenolic Resin Intermediate (C1)

165 parts by mass of a resin (hydroxyl equivalent: 165 g/eq, softening point of 85° C.) obtained by a polyaddition reaction of dicyclopentadiene with phenol and 590 parts by mass of toluene were put into a flask equipped with a thermometer, a dropping funnel, a cooling tube, a fractionating column, and a stirrer, then, the air in the system was replaced with nitrogen under reduced pressure, and the resin was dissolved. Next, 50 parts by mass of isophthalic acid chloride was put thereinto, the temperature in the system was controlled to 60° C. or lower while performing nitrogen gas purge, and 102 parts by mass of 20% aqueous sodium hydroxide solution was added dropwise over a period of 3 hours. Next, stirring was performed for 1.0 hour under the conditions. After the reaction ended, the resultant product was left to stand for liquid-liquid separation, and the aqueous layer was removed. Furthermore, after water was poured into the toluene layer in which the reaction product was dissolved, mixing was performed under stirring for about 15 minutes, the resultant product was left to stand for liquid-liquid separation, and the aqueous layer was removed. This operation was repeated until the pH of the aqueous layer became 7. Thereafter, the moisture was removed by decanter dehydration, and the toluene was removed by reduced pressure dehydration, whereby a phenolic resin intermediate (C1) was obtained. The softening point of the phenolic resin intermediate (C1) was 125° C., and the hydroxyl equivalent calculated from the amount of raw materials put was 395 g/eq. The softening point was 125° C. The GPC chart of the obtained phenolic resin intermediate (C1) is shown in FIG. 1, a C$^{13}$NMR chart of the obtained phenolic resin intermediate (C1) is shown in FIG. 2, and an MS spectrum of the obtained phenolic resin intermediate (C1) is shown in FIG. 3. In the $^{13}$C-NMR chart, a peak derived from the carbonyl carbon of an ester group was confirmed in the vicinity of 165 ppm. In addition, in the obtained phenolic resin intermediate (C1), the value corresponding to 1 in General Formula (1) calculated from the GPC chart was 0.95.

Example 1

Preparation of Active Ester Resin Containing Phosphorus Atom (1)

154 parts by mass of 9,10-dihydro-9-oxa-10-phosphaphenanthrene-10-oxide, 97 parts by mass of p-anisaldehyde, and 395 parts by mass of the phenolic resin intermediate (C1) were put into a flask equipped with a thermometer, a cooling tube, a fractionating column, and a stirrer, the temperature was raised to 90° C., and the mixture was stirred while blowing nitrogen thereinto. Thereafter, the temperature was raised to 180° C., and stirring was performed for 5 hours, and then, the temperature was further raised to 190° C., and stirring was performed for 9 hours. Water was removed from the reaction mixture by heating under reduced pressure, whereby an active ester resin containing a phosphorus atom (1) was obtained. The softening point of the obtained active ester resin containing a phosphorus atom (1) was 180° C., the active group equivalent calculated from the amount of raw materials put was 323 g/eq, and the phosphorus atom content was 3.6% by mass. Here, the active groups in the active ester resin containing a phosphorus atom refers to an arylcarbonyloxy group and a phenolic hydroxyl group contained in a resin structure. The GPC chart of the active ester resin containing a phosphorus atom (1) is shown in FIG. 4.

Example 2

Preparation of Active Ester Resin Containing Phosphorus Atom (2)

An active ester resin containing a phosphorus atom (2) was obtained in the same manner as in Example 1 except that the amount of 9,10-dihydro-9-oxa-10-phosphaphenanthrene-10-oxide was changed to 216 parts by mass, and the amount of p-anisaldehyde was changed to 136 parts by mass. The softening point of the obtained active ester resin containing a phosphorus atom (2) was 200° C., the active group equivalent calculated from the amount of raw materials put was 370 g/eq, and the phosphorus atom content was 4.4% by mass. The GPC chart of the active ester resin containing a phosphorus atom (2) is shown in FIG. 5.

Example 3

Preparation of Active Ester Resin Containing Phosphorus Atom (3)

An active ester resin containing a phosphorus atom (3) was obtained in the same manner as in Example 1 except that the amount of 9,10-dihydro-9-oxa-10-phosphaphenanthrene-10-oxide was changed to 108 parts by mass, and the amount of p-anisaldehyde was changed to 68 parts by mass. The softening point of the obtained active ester resin containing a phosphorus atom (3) was 150° C., the active group equivalent calculated from the amount of raw materials put was 281 g/eq, and the phosphorus atom content was 2.9% by mass.

Comparative Preparation Example 1

Preparation of Active Ester Resin (1')

165 parts by mass of a resin (hydroxyl equivalent: 165 g/eq, softening point of 85° C.) obtained by a polyaddition reaction of dicyclopentadiene with phenol, 72 parts by mass of naphthol, and 630 parts by mass of toluene were put into a flask equipped with a thermometer, a dropping funnel, a cooling tube, a fractionating column, and a stirrer, the air in the system was replaced with nitrogen under reduced pressure, and the mixture was dissolved. Next, 151.5 parts by mass of isophthalic acid chloride was put thereinto, the air in the system was replaced with nitrogen under reduced pressure, and the mixture was dissolved. Thereafter, the temperature in the system was controlled to 60° C. or lower while performing nitrogen gas purge, and 210 parts by mass of 20% aqueous sodium hydroxide solution was added dropwise over a period of 3 hours. Next, stirring was performed for 1.0 hour under the conditions. After the reaction ended, the reaction product was left to stand for liquid-liquid separation, and the aqueous layer was removed. Furthermore, after water was poured into the toluene layer in which the reaction product was dissolved, mixing was performed under stirring for about 15 minutes, the resultant product was left to stand for liquid-liquid separation, and the aqueous layer was removed. This operation was repeated until the pH of the aqueous layer became 7. Thereafter, the moisture was removed by decanter dehydration, and the toluene was removed by reduced pressure dehydration, whereby an active ester resin (1') was synthesized. The softening point of the obtained active ester resin (1') was 150° C., and the active group equivalent calculated from the amount of raw materials put was 223 g/eq.

Examples 4 to 6 and Comparative Example 1

<Adjustment and Evaluation of Physical Properties of Epoxy Resin Composition>

"N-680" (a cresol novolak type epoxy resin, epoxy equivalent: 215 g/eq) manufactured by DIC Corporation as an epoxy resin and the active ester resins containing a phosphorus atom (1) to (3) or the active ester resin (1') as a curing agent were blended respectively in proportions shown in the following Table 1, 0.05 phr of dimethylaminopyridine was added thereto as a curing catalyst, and methyl ethyl ketone was blended such that the non-volatile content (N.V.) of each composition finally became 58% by mass, whereby an epoxy resin composition was adjusted. Next, a laminate plate was produced under conditions described below, and various evaluation tests were performed by the methods described below. The results are shown in Table 1.

<Laminated Plate Production Conditions>

Basic material: glass cloth "#2116" (210 mm×280 mm) manufactured by Nitto Boseki Co., Ltd.

Number of plys: 6, Prepreging conditions: 160° C.

Curing conditions: at 200° C. and 40 kg/cm² for 1.5 hours, plate thickness after molding: 0.8 mm <Evaluation Measurement of Heat Resistance (Glass Transition Temperature)>

The temperature at which the change in elastic modulus became maximum (at which tan δ change ratio is the greatest) was evaluated as the glass transition temperature using a viscoelasticity measuring apparatus (DMA: solid viscoelasticity measuring apparatus RSAII manufactured by Rheometric Scientific Inc., rectangular tension method; frequency of 1 Hz, temperature raising rate of 3° C./min).

<Evaluation of Heat Resistance Peeling Properties>

T288: evaluation was performed according to the IPC TM650 test method.

<Measurement of Dielectric Constant and Dielectric Tangent>

The dielectric constant and the dielectric tangent of the test piece at 1 GHz were measured after being stored for 24 hours in a room at 23° C. and 50% humidity after absolute drying using an impedance material analyzer "HP4291B" manufactured by Agilent Technologies according to JIS-C-6481.

<Evaluation of Flame Retardancy>

A burning test was performed on the five test pieces according to the UL-94 test method.

TABLE 1

| | | Example 4 | Example 5 | Example 6 | Comparative Example 1 |
|---|---|---|---|---|---|
| Epoxy resin | N-680 | 40.0 | 36.8 | 43.3 | 49.1 |
| Curing agent | Active ester resin containing a phosphorus atom (1) | 60.0 | | | |
| | Active ester resin containing a phosphorus atom (2) | | 63.2 | | |
| | Active ester resin containing a phosphorus atom (3) | | | 56.7 | |
| | Active ester resin (1') | | | | 50.9 |
| Phosphorus content in cured product (% by mass) | | 2.2 | 2.8 | 1.6 | 0 |
| Heat resistance (° C.) | | 182 | 175 | 179 | 170 |
| Heat resistance peeling properties (T288) (min) | | 120 | 100 | 110 | 63 |
| Dielectric constant (1 GHz) | | 3.6 | 3.8 | 3.8 | 4.0 |

TABLE 1-continued

|  | Example 4 | Example 5 | Example 6 | Comparative Example 1 |
|---|---|---|---|---|
| Dielectric tangent (1 GHz) | 0.009 | 0.011 | 0.010 | 0.013 |
| Flame retardancy test | V-0 | V-1 | V-0 | burn |
| Maximum burning time in a single flame contact (sec) | 7 | 10 | 9 | — |
| Total burning time of five test pieces (sec) | 39 | 50 | 49 | — |

The invention claimed is:

1. An active ester resin containing a phosphorus atom, which has Structure (I) in which a structural unit (α) in which a plurality of aromatic nuclei (X) are connected through an alicyclic hydrocarbon group is connected with another structural unit (α) through an arylene dicarbonyloxy group,
wherein, of the aromatic nuclei (X) present in the resin, two aromatic nuclei (X) positioned at the terminals of Structure (I) each have a phenolic hydroxyl group, and at least one of the two aromatic nuclei (X) has a structural site (Y) represented by the following Structural Formula (y1) or (y3) as a substituent on an aromatic nucleus thereof:

[Chem. 1]

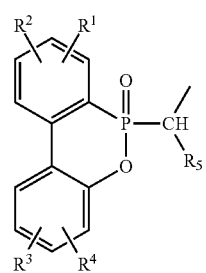

(y1)

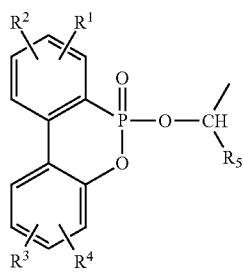

(y3)

wherein, in Structural Formula (y1) or (y3), each of $R^1$, $R^2$, $R^3$, and $R^4$ independently represents any one of a hydrogen atom, an alkyl group having 1 to 4 carbon atoms, an alkoxy group having 1 to 4 carbon atoms, a halogen atom, a phenyl group, and an aralkyl group, and $R^5$ represents any one of a hydrogen atom, an alkyl group having 1 to 6 carbon atoms, a phenyl group, a naphthyl group, an anthryl group, a phenyl group having one or more alkyl groups or alkoxy groups having 1 to 4 carbon atoms on an aromatic nucleus thereof, a naphthyl group having one or more alkyl groups or alkoxy groups having 1 to 4 carbon atoms on an aromatic nucleus thereof, an anthryl group having one or more alkyl groups or alkoxy groups having 1 to 4 carbon atoms on an aromatic nucleus thereof, and an aralkyl group.

2. A production method of an active ester resin containing a phosphorus atom, the method comprising:
reacting a phenolic compound (A) having a structure in which the plurality of aromatic nuclei (X) are connected through an alicyclic hydrocarbon group with an aromatic dicarboxylic acid or dihalide thereof (B) in a proportion in which the total of the carboxyl group or the acid halide group contained in the aromatic dicarboxylic acid or the dihalide thereof (B) is within a range of 0.25 moles to 0.75 moles with respect to the total 1 mole of the hydroxyl groups contained in the phenolic compound (A), to obtain a phenolic resin intermediate (C); and
reacting the phenolic resin intermediate (C), an aldehyde compound (D), and a compound containing a phosphorus atom (E) represented by any one of the following Structural Formula (e1),

[Chem. 2]

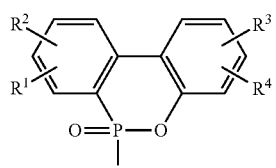

(e1)

wherein, in Structural Formula (e1), each of $R^1$, $R^2$, $R^3$, and $R^4$ independently represents any one of a hydrogen atom, an alkyl group having 1 to 4 carbon atoms, an alkoxy group having 1 to 4 carbon atoms, a halogen atom, a phenyl group, and an aralkyl group, and z represents a hydrogen atom or a hydroxyl group.

3. An active ester resin containing a phosphorus atom, which is obtained by the production method according to claim 2.

4. The active ester resin containing a phosphorus atom according to claim 1, which has a molecular structure represented by the following Structural Formula (2):

[Chem. 3]

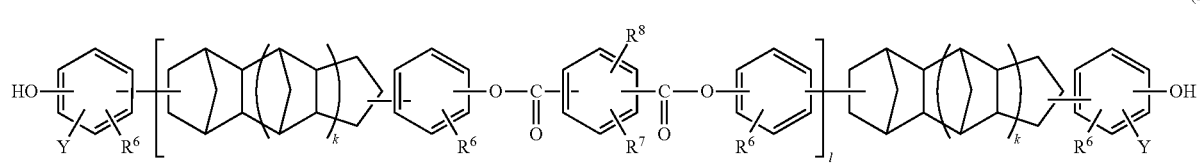

(2)

wherein each of $R^6$, $R^7$, and $R^8$ independently represents any one of a hydrogen atom, an alkyl group having 1 to 4 carbon atoms, an alkoxy group having 1 to 4 carbon atoms, a halogen atom, a phenyl group, and an aralkyl group, Y represents a hydrogen atom or a structural site represented by the following Structural Formula (y1) or (y3), at least one of two Y's in the molecular structure represents a structural site represented by Structural Formula (y1) or (y3), k is 0 or 1, and l, which is the average of repeating units, is 0.25 to 1.5,

[Chem. 4]

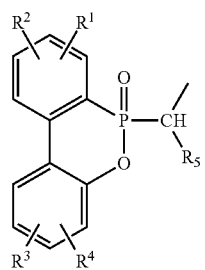

(y1)

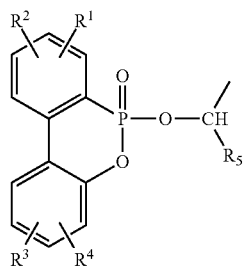

(y3)

wherein, in Structural Formula (y1) or (y3), each of $R^1$, $R^2$, $R^3$, and $R^4$ independently represents any one of a hydrogen atom, an alkyl group having 1 to 4 carbon atoms, an alkoxy group having 1 to 4 carbon atoms, a halogen atom, a phenyl group, and an aralkyl group, and $R^5$ represents any one of a hydrogen atom, an alkyl group having 1 to 6 carbon atoms, a phenyl group, a naphthyl group, an anthryl group, a phenyl group having one or more alkyl groups or alkoxy groups having 1 to 4 carbon atoms on an aromatic nucleus thereof, a naphthyl group having one or more alkyl groups or alkoxy groups having 1 to 4 carbon atoms on an aromatic nucleus thereof, an anthryl group having one or more alkyl groups or alkoxy groups having 1 to 4 carbon atoms on an aromatic nucleus thereof, and an aralkyl group.

5. An epoxy resin composition, comprising:
the active ester resin containing a phosphorus atom according to claim 1; and
an epoxy resin.

6. A cured product obtained by curing the epoxy resin composition according to claim 5.

\* \* \* \* \*